(12) United States Patent
Cao

(10) Patent No.: US 10,948,790 B2
(45) Date of Patent: Mar. 16, 2021

(54) DISPLAY PANEL MANUFACTURING METHOD AND DISPLAY PANEL

(71) Applicant: Shenzhen China Star Optoelectronics Semiconductor Display Technology Co., Ltd., Shenzhen (CN)

(72) Inventor: Wu Cao, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 404 days.

(21) Appl. No.: 16/091,106

(22) PCT Filed: Aug. 22, 2018

(86) PCT No.: PCT/CN2018/101680
§ 371 (c)(1),
(2) Date: Oct. 4, 2018

(87) PCT Pub. No.: WO2019/214108
PCT Pub. Date: Nov. 14, 2019

(65) Prior Publication Data
US 2019/0346727 A1 Nov. 14, 2019

(30) Foreign Application Priority Data
May 10, 2018 (CN) .......................... 201810443917.7

(51) Int. Cl.
| | | |
|---|---|---|
| G02F 1/1339 | (2006.01) | |
| G02F 1/1362 | (2006.01) | |
| H01L 27/12 | (2006.01) | |
| G03F 7/00 | (2006.01) | |
| G03F 7/038 | (2006.01) | |
| G03F 7/16 | (2006.01) | |
| G03F 1/32 | (2012.01) | |
| G03F 7/20 | (2006.01) | |

(Continued)

(52) U.S. Cl.
CPC .... *G02F 1/136209* (2013.01); *G02F 1/13394* (2013.01); *G03F 1/32* (2013.01); *G03F 7/0007* (2013.01); *G03F 7/038* (2013.01); *G03F 7/039* (2013.01); *G03F 7/162* (2013.01); *G03F 7/20* (2013.01); *G03F 7/26* (2013.01); *H01L 27/1262* (2013.01); *H01L 27/1288* (2013.01); *G02F 1/13396* (2021.01); *G02F 1/136222* (2021.01)

(58) Field of Classification Search
CPC ........ G03F 7/0007; G03F 7/038; G03F 7/039; G03F 7/20; G03F 7/2002; G02F 1/13394; G02F 1/136209; G02F 2001/13396
USPC .................. 430/320, 321; 156/156
See application file for complete search history.

(56) References Cited

U.S. PATENT DOCUMENTS

| | | | | |
|---|---|---|---|---|
| 2003/0123018 A1* | 7/2003 | Kim | .................... | G02F 1/13394 349/155 |
| 2005/0275768 A1* | 12/2005 | Tsubata | ............... | G02F 1/13394 349/106 |

(Continued)

*Primary Examiner* — John A McPherson
(74) *Attorney, Agent, or Firm* — Mark M. Friedman

(57) ABSTRACT

A display panel manufacturing method and display panel are provided. By forming a first spacer on a first photoresist reservation region of a light-shielding layer and forming a second spacer on a second photoresist reservation region, photoresist material required to be removed is preserved to increase material usage rate such that display panel manufacturing processes are reduced and productivity is raised.

16 Claims, 10 Drawing Sheets

(51) Int. Cl.
　　　*G03F 7/26*　　　(2006.01)
　　　*G03F 7/039*　　　(2006.01)

(56) References Cited

U.S. PATENT DOCUMENTS

| | | | |
|---|---|---|---|
| 2009/0033841 A1* | 2/2009 | Li | G02F 1/133516 349/106 |
| 2009/0115954 A1* | 5/2009 | Tseng | G02F 1/13394 349/156 |
| 2012/0038867 A1* | 2/2012 | Kwon | G02F 1/133512 349/110 |

* cited by examiner

DISPLAY PANEL MANUFACTURING METHOD AND DISPLAY PANEL

FIELD OF INVENTION

The present invention relates to displaying technology fields, especially relates to a display panel manufacturing method and a display panel.

BACKGROUND OF INVENTION

With development of science and technology and progress of society, liquid crystal displays are extensively used in various fields. For example, thin film transistor liquid crystal displays (TFT LCDs) are characterized by lightness, thinness, and smallness. At the same time, the TFT LCDs have low power consumption, no radiation, relative lower manufacturing costs, and is more widely used in the tablet display industry.

A display panel is a main component of the thin film transistor liquid crystal display, and can be divided into a thin film transistor array substrate and a color filter substrate according to structure composition. In conventional display panel design, when a color filter and pixel electrodes are aligned, alignment is poor and can cause light leakage, decrease aperture ratio, and reduce brightness of the panel.

In order to solve the problem of light leakage due to poor alignment, reduction of aperture ratio and reduction of panel brightness, one existing solution is to integrate a color filter on an array substrate (COA) and a black matrix on an array substrate (BOA) technology, but such technique is cumbersome in production and affects production efficiency.

SUMMARY OF INVENTION

Technical Issue

The embodiment of the present invention provides a display panel manufacturing method and display panel that are able to reduce manufacturing processes and increase material usage rate and productivity.

Technical Solution

The technical solution provided by the present invention is as follows.

The present invention provides a display panel manufacturing method comprising steps as follows:

providing a substrate, wherein the substrate comprises a display region and a non-display region;

forming a photoresist layer on the substrate, and exposing and developing the photoresist layer to form a photoresist pattern on the photoresist layer, wherein the photoresist pattern comprises a first photoresist reservation region and a second photoresist reservation region; and coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer;

wherein the step of forming a photoresist layer on the substrate employs a first mask plate to expose and develop the photoresist layer to form the photoresist pattern, and the photoresist pattern comprises the first photoresist reservation region and the second photoresist reservation region; and wherein the photoresist layer is made of positive photoresist or negative photoresist.

According to a preferred embodiment of the present invention, the first mask plate comprises a first light-transmitting region and a second light-transmitting region, a projection of the first light-transmitting, region on the photoresist layer coincides with the first photoresist reservation region, and a projection of the second light-transmitting region on the photoresist layer coincides with the second photoresist reservation region.

According to a preferred embodiment of the present invention, a light transmittance of the first light-transmitting region is a first predetermined value, a light transmittance of the second light-transmitting region is a second predetermined value, and the first predetermined value is less than the second predetermined value.

According to a preferred embodiment of the present invention, a thickness of the photoresist layer on the first photoresist reservation region is greater than a thickness of the photoresist layer on the second photoresist reservation region.

According to a preferred embodiment of the present invention, the display panel manufacturing method comprises coating the light-shielding material on the portion of the substrate with the photoresist pattern, employing a second mask, plate to expose the light-shielding material, and developing the exposed light-shielding material to form the light-shielding layer on the non-display region of the substrate, wherein the light-shielding layer forms the first spacer on the first photoresist reservation region and forms the second spacer on the second photoresist reservation region, and the height of the first spacer is greater than the height of the second spacer.

According to a preferred embodiment of the present invention, the second mask plate comprises a light-shielding region and a full light-transmitting region, a projection of the light-shielding region on the substrate coincides with the non-display region, and a projection of the full light-transmitting region on the substrate coincides with the display region.

According to a preferred embodiment of the present invention, the light-shielding material is black light-shielding resin.

A display panel manufacturing method, comprises:

providing a substrate, wherein the substrate comprises display region and non-display region;

forming a photoresist layer on the substrate, and exposing and developing the photoresist layer to form a photoresist pattern on the photoresist layer, wherein the photoresist pattern comprises a first photoresist reservation region and a second photoresist reservation region; and coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer.

According to a preferred embodiment of the present invention, the display panel manufacturing method comprises employing a first mask plate to expose and develop the photoresist layer to form the photoresist pattern, and the photoresist pattern comprising the first photoresist reservation region and the second photoresist reservation region.

According to a preferred embodiment of the present invention, the first mask plate comprises a first light-transmitting region and a second light-transmitting region, a projection of the first light-transmitting region on the photoresist layer coincides with the first photoresist reservation region, and a projection of the second light-transmitting region on the photoresist layer coincides with the second photoresist reservation region.

According to a preferred embodiment of the present invention, a light transmittance of the first light-transmitting region is a first predetermined value, a light transmittance of the second light-transmitting region is a second predetermined value, and the first predetermined value is less than the second predetermined value.

According to a preferred embodiment of the present invention, a thickness of the photoresist layer on the first photoresist reservation region is greater than a thickness of the photoresist layer on the second photoresist reservation region.

According to a preferred embodiment of the present invention, the display panel manufacturing method comprises employing a second mask plate to expose the light-shielding material, and developing the exposed light-shielding material to form the light-shielding layer on the non-display region of the substrate, wherein the light-shielding layer forms the first spacer on the first photoresist reservation region and forms the second spacer on the second photoresist reservation region and the height of the first spacer is greater than the height of the second spacer.

According to a preferred embodiment of the present invention, the second mask plate comprises a light-shielding region and a full light-transmitting region, a projection of the light-shielding region on the substrate coincides with the non-display region, and a projection of the full light-transmitting region on the substrate coincides with the display region.

According to a preferred embodiment of the present invention, the photoresist layer is made of positive photoresist or negative photoresist.

According to a preferred embodiment of the present invention, the light-shielding material black light-shielding resin.

Accordingly, the present invention also provides a display panel that is made by the method of any embodiment of the present invention.

Advantageous Effect

The present invention preserves the photoresist required to be removed and, increases material usage rate to reduce display panel manufacturing processes and raise productivity.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

Embodiment 1

Figure 1:
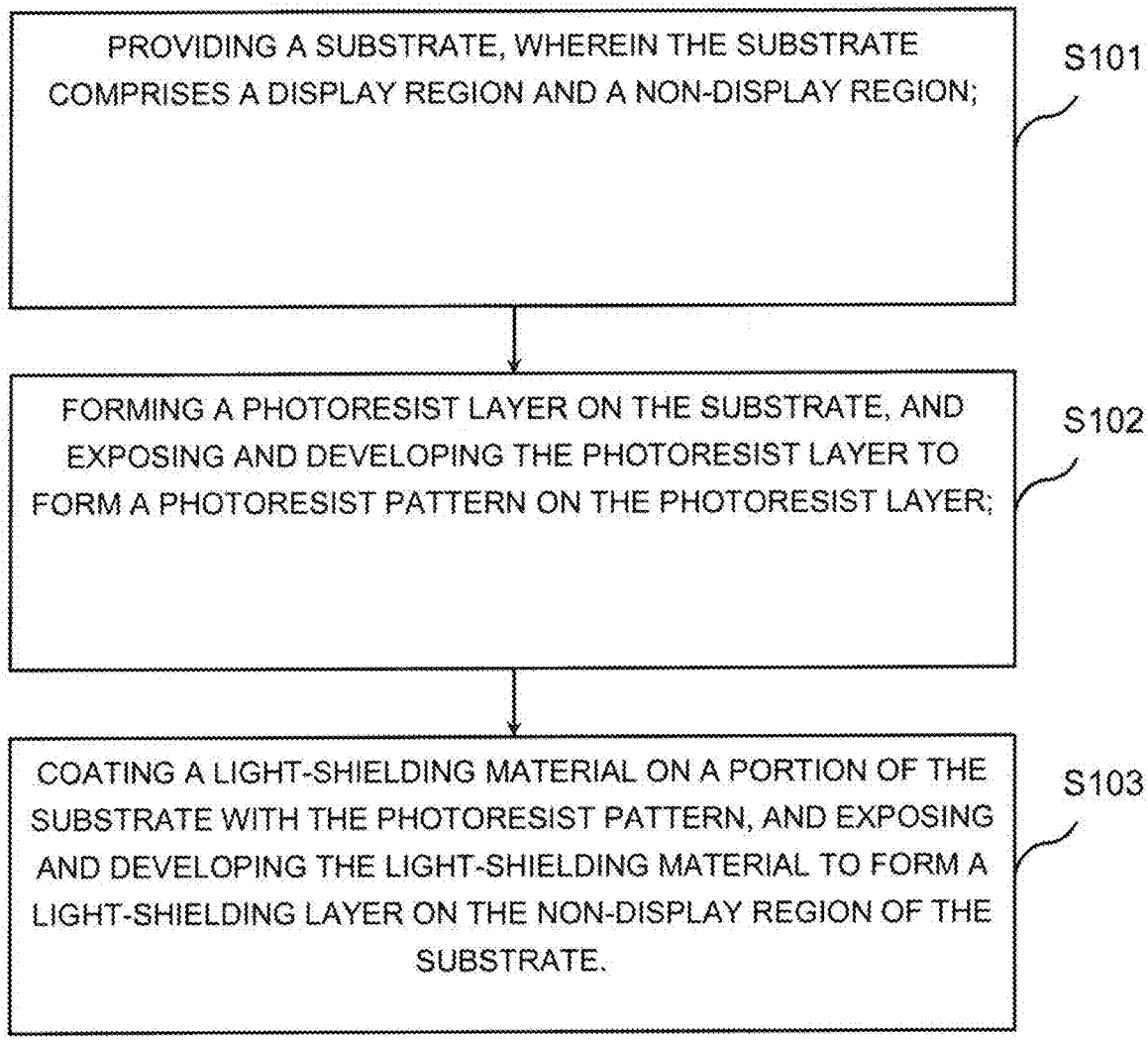
FIG. 1 is a schematic flowchart of a display panel manufacturing method provided by an embodiment of the embodiment of the present invention.

With reference to FIG. 1, FIG. 1 is a schematic flowchart of a display panel manufacturing method provided by an embodiment of the embodiment of the present invention. The method includes:

S101, providing a substrate, wherein the substrate comprises a display region and a non-display region;

S102, forming a photoresist layer on the substrate, and exposing and developing the photoresist layer to form a photoresist pattern on the photoresist layer;

S103, coating a light-shielding material on a portion of the substrate with the photoresist pattern, and exposing and developing the light-shielding material to form a light-shielding layer on the non-display region of the substrate.

Figure 2:
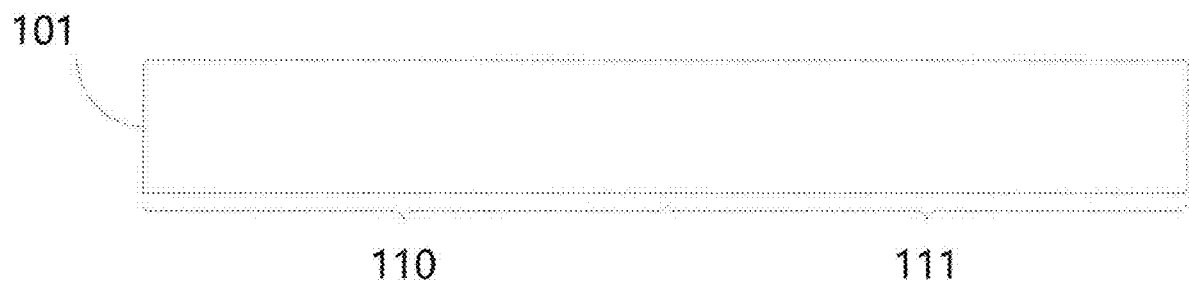
FIGS. 2 to 5 are schematic views of steps of an array substrate manufacturing method provided by the embodiment of the present invention.

In the step S101, as shown in FIG. 2, the substrate 101 is provided. The substrate comprises a display region 110 and a non-display region 110. For example, the substrate 101 can be an array substrate, the substrate 101 can comprise the display region 110 for displaying images and the non-display region 111 for partitioning or dividing different pixels.

Figure 3:
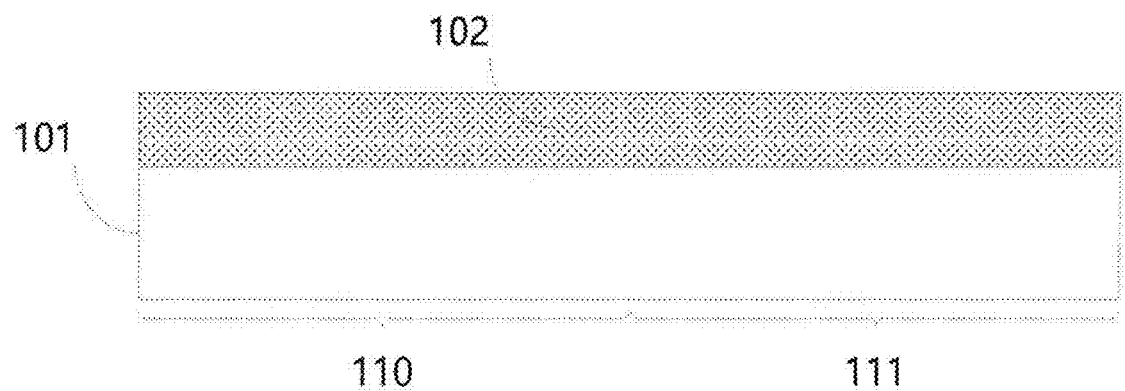
Figure 4:
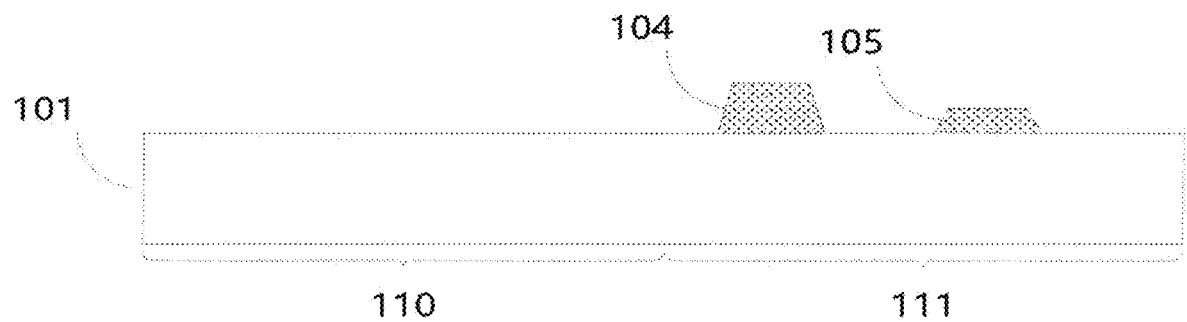

In the step S102, as shown in FIGS. 3 and 4, the photoresist layer 102 is formed on the substrate 101, a photoresist pattern is formed on the photoresist layer 102 by exposing and developing processes. The photoresist pattern comprises a first photoresist reservation region 104 and a second photoresist reservation region 105.

Figure 5:
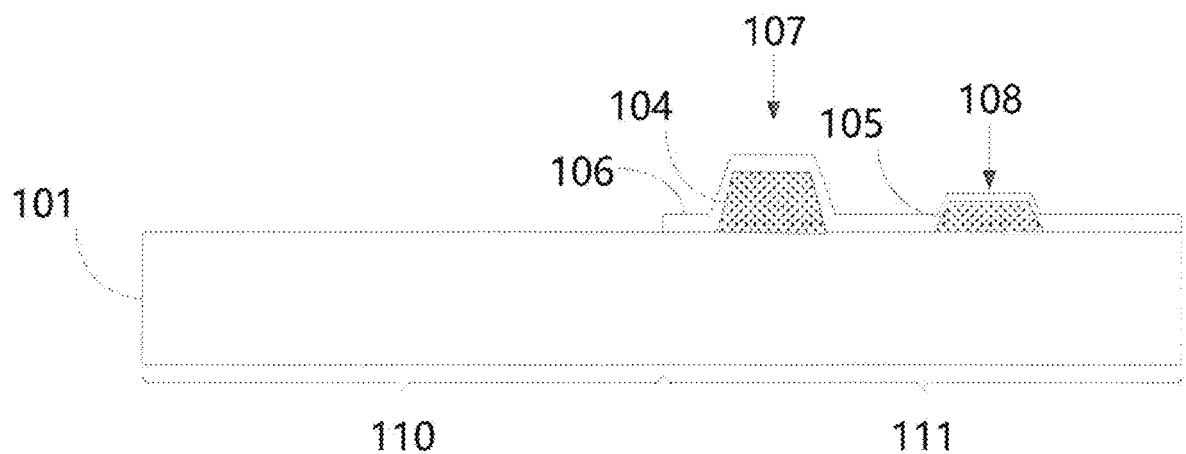

In the step S103, as shown in FIG. 5, the light-shielding material 106 is coated on the substrate 101 formed with the photoresist pattern, and the light-shielding material 106 is exposed and developed to form the light-shielding layer on the non-display region 111 of the substrate 101. The light-shielding layer forms a first spacer 107 on, the first photoresist reservation region 104, and forms a second spacer 108 on the second photoresist reservation region 105, and a height of the first spacer 107 is greater than a height of the second spacer 108. It should be noted that the first spacer 107 comprises a first photoresist reservation region 104 and a light-shielding material 106, and the second spacer 108 comprises a second photoresist reservation region 105 and a light-shielding material 106.

The embodiment of the present invention discloses a display panel manufacturing method and a display panel. The embodiment of the present invention, by providing a substrate 101 wherein the substrate 101 comprises the display region 110 and the non-display region 111, the photoresist layer 102 is formed on the substrate 101, the photoresist layer 102 is exposed and developed to form the photoresist pattern on the non-display region 111, and the light-shielding material 106 is coated on the photoresist pattern to form the first spacer 107 and the second spacer 108 substrate 101 in the non-display region 111, takes advantages of the photoresist material, increases material usage rate to reduce display panel manufacturing processes and increase productivity.

Embodiment 2

According to the display panel manufacturing method of embodiment 1. The following will give further detailed examples.

The embodiment of the present invention will be described by taking the display panel specifically integrated on the thin film transistor array substrate as an example.

Figure 6:
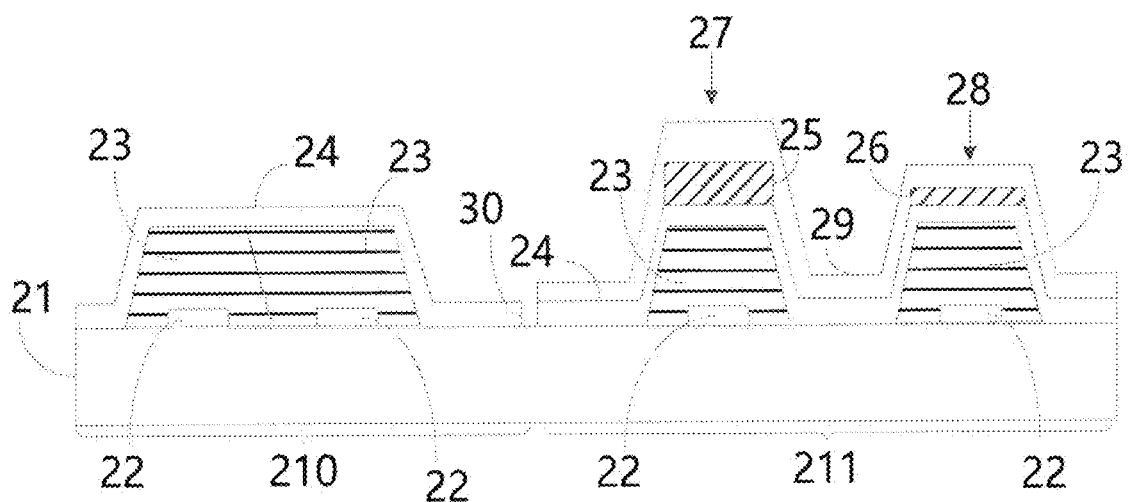
FIG. 6 is a schematic cross-sectional view of a display panel provided by a preferred embodiment of the present invention.

With reference to FIG. 6, FIG. 6 is a schematic cross-sectional view of a display panel provided by a preferred embodiment of the present invention. Taking forming the first spacer and the second spacer on an inorganic thin film as an example, the present invention comprises a thin film transistor array substrate 21, the array substrate comprises a display region 210 and a non-display region 211. A thin film transistor 22 is disposed on the array substrate 21. Color resists 23 are disposed on thin film transistor 22. An inorganic thin film 24 covers the color resists 23. A first photoresist reservation region 25 and a second photoresist reservation region 26 are disposed on the inorganic thin film 24. A light-shielding material 29 is coated on the first photoresist reservation region 25 and the second photoresist reservation region 26. The first photoresist reservation region 25, the color resists 23 and the inorganic thin film 24 constitute a first spacer 27. The second photoresist reservation region 26, the color resists 23 and the inorganic thin film 24 constitute a second spacer 28. A via, hole 30 is disposed in the inorganic thin film 24.

Figure 7:
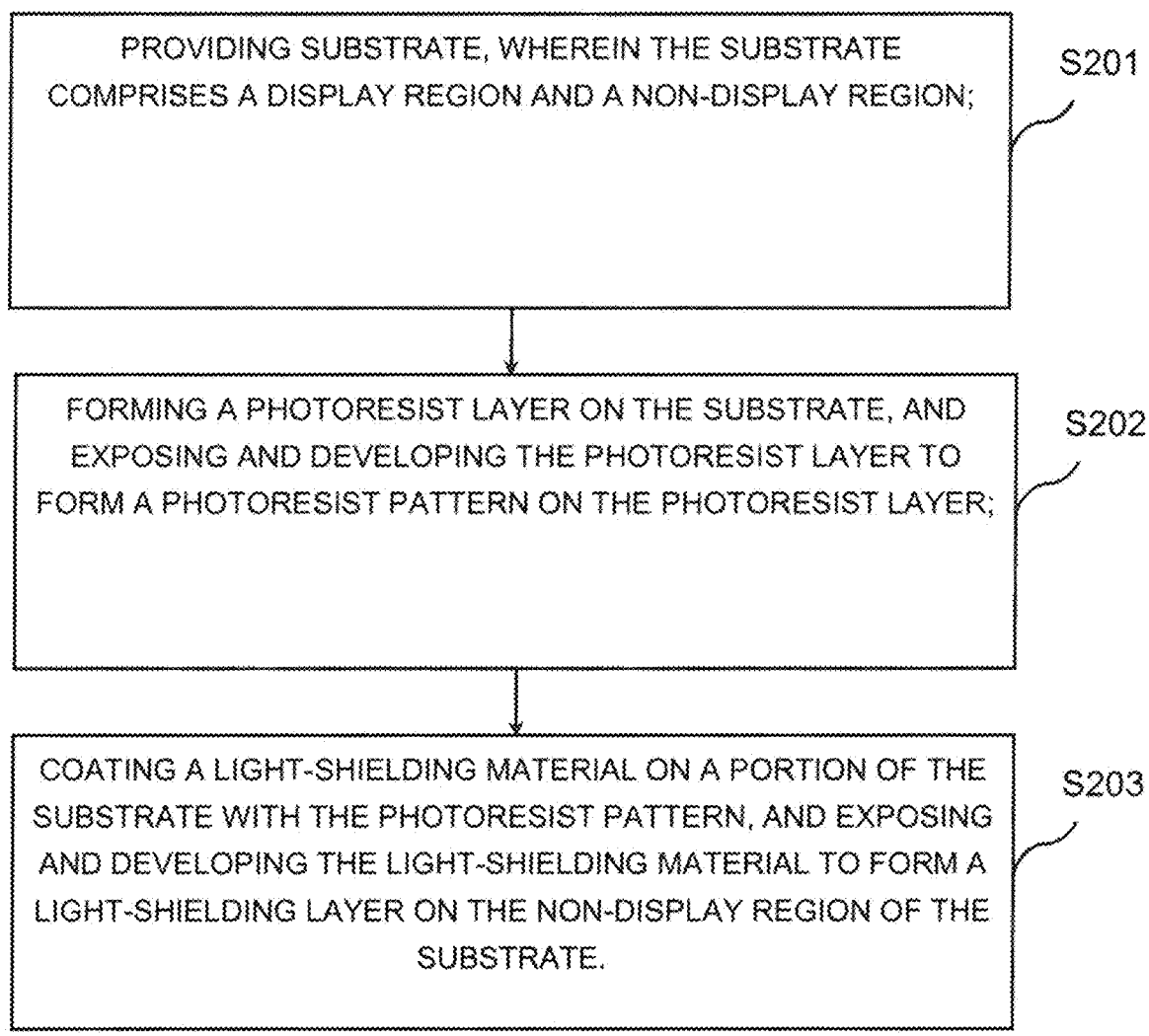
FIG. 7 is a schematic flowchart of a display panel manufacturing method provided by a preferred embodiment of the present invention.

With reference to FIG. 7, FIG. 7 is, a schematic flowchart of a display panel manufacturing method provided by a preferred embodiment of the present invention. The display panel manufacturing method comprises:

S201, providing substrate, wherein the substrate comprises a display region and a non-display region;

S202, forming a photoresist layer on the substrate, and exposing and developing the photoresist layer to form a photoresist pattern on the photoresist layer;

S203, coating a light-shielding material on a portion of the substrate with the photoresist pattern, and exposing and developing the light-shielding material to form a light-shielding layer on the non-display region of the substrate.

Figure 8:
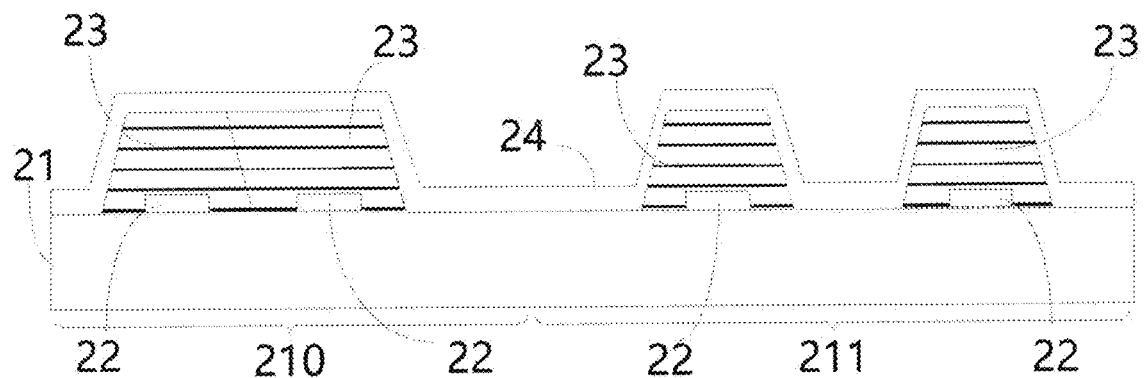
FIGS. 8 to 14 are schematic views of detailed steps of an array substrate manufacturing method provided by a preferred embodiment of the present invention.

In the step S201, with reference to FIG. 8, a substrate 21 is provided. The substrate 21 can be a thin film transistor array substrate, for example, the thin film transistor array substrate 21 can comprise a thin film transistor 22, color resists 23 and an inorganic thin film 24, and can comprise data lines, scan lines, thin film transistors and pixel electrodes (not shown). The thin film transistor array substrate 21 includes the display region 210 for displaying images and the non-display region 211 for partitioning or divide different pixels.

Figure 9:
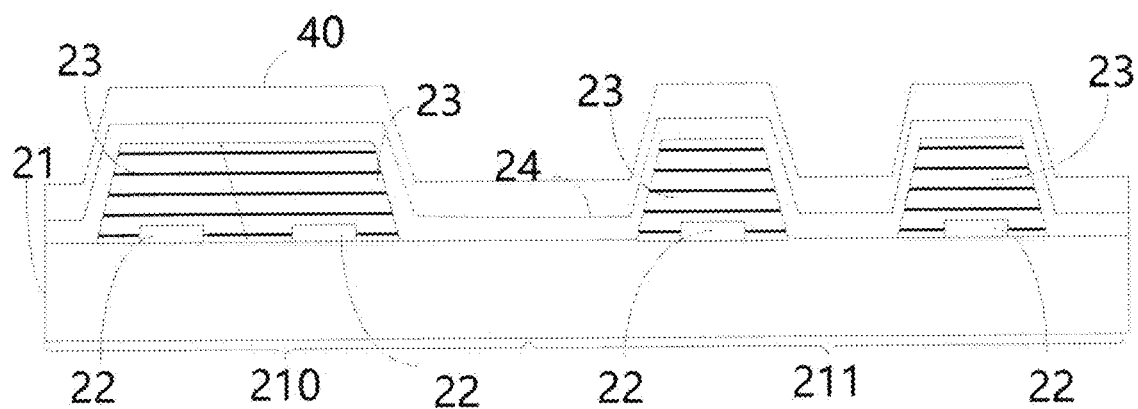
Figure 10:
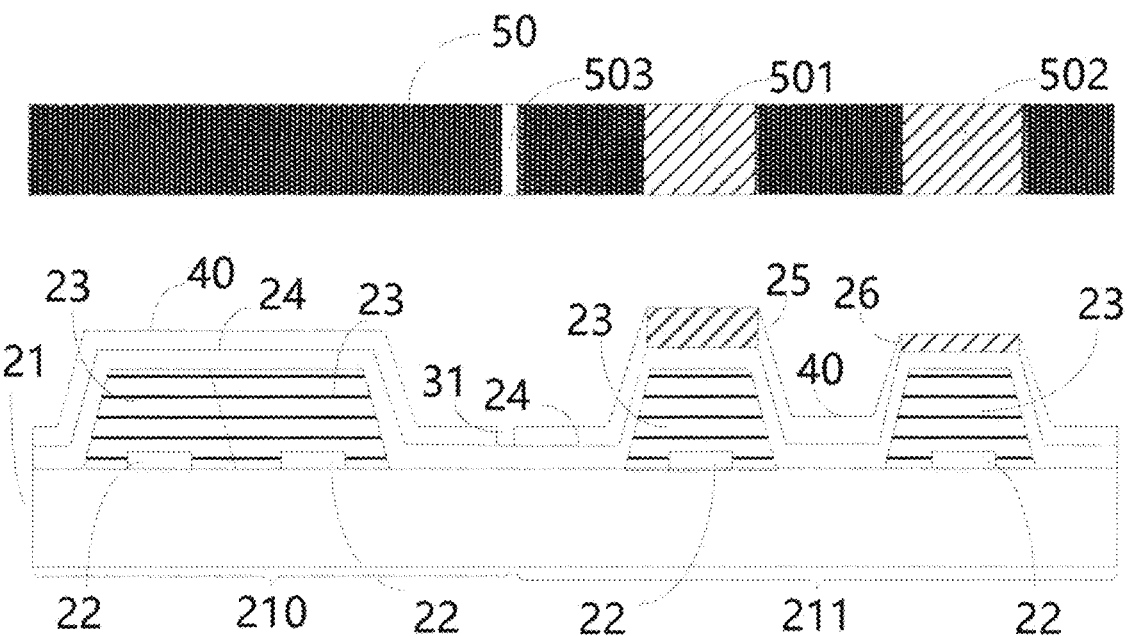
Figure 11:
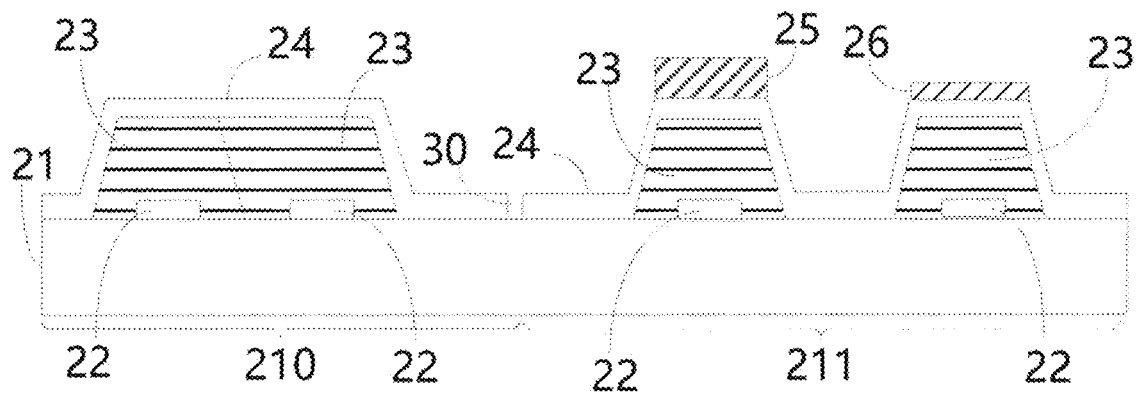

In step S202, as shown in FIGS. 9, 10 and 11, the photoresist layer 40 is formed on the substrate 21, a first mask plate 50 is employed to expose the photoresist layer 40, and the photoresist layer 40 is etched through an etching process to form the photoresist pattern. The photoresist pattern comprises a first photoresist reservation region 25 and a second photoresist reservation region 26.

Preferably, the first mask plate 50 comprises a first light-transmitting region 501 and a second light-transmitting region 502. A projection of the first, light-transmitting region 501 on the photoresist layer 40 coincides with the first photoresist reservation region 25. A projection of the second light-transmitting region 502 on the photoresist layer 40 coincides with the second photoresist reservation region 26.

A light transmittance of the first light-transmitting region 501 is a first predetermined value. A light transmittance of the second light-transmitting region 502 is a second predetermined value. The first predetermined value is less than the second predetermined value. A thickness of the photoresist layer 40 on the first photoresist reservation region 25 is greater than a thickness of the photoresist layer 40 on the second photoresist reservation region 26.

For example, on the thin film transistor array substrate 21, a positive photoresist layer 40 required by a process of patternizing the inorganic thin film 24 is employed. A halftone mask plate 50 can be used to proceed with the exposing process. The halftone mask plate 50 comprises a first light-transmitting region 501, a second light-transmitting region 502 and a third light-transmitting region 503. First, by means of spin coating, a positive photoresist layer 40 is formed on the inorganic thin film 24. Then, the positive photoresist layer 40 is processed with the exposing and developing processes through the halftone mask plate to form the first photoresist reservation region 25, the second photoresist reservation region 26 and the third region 31 on the positive photoresist layer 40. After exposure and development, the positive photoresist layer 40 can be removed by a dry etching process to form the first photoresist reservation region 25, the second photoresist reservation region 26 on the inorganic thin film 24 and form the via hole 30 on the inorganic thin film 24. The via hole 30 is configured to connect pixel electrodes and metal layers (the pixel electrodes and the metal layer are not shown). It should be noted that a projection of the first light-transmitting region 501 on the positive photoresist layer 40 coincides with the first photoresist reservation region 25, a projection of the second light-transmitting region 502 on positive photoresist layer 40 coincides with the second photoresist reservation region 26, and a projection of the third light-transmitting region 503 on the positive photoresist layer 40 coincides with the third region 31. The light transmittance of the first light-transmitting region 501 can be 0%, the light transmittance of the second light-transmitting region 502 can be 50%, and the light transmittance of the third light-transmitting region 503 can be 100%. Therefore, the thickness of the positive photoresist layer 40 on the first photoresist reservation region 25 is greater than the thickness of the positive photoresist layer 40 on the second photoresist reservation region 26. It should be noted that, the photoresist layer 40 can also be the negative photoresist, and corresponding steps are the same as the above steps and will not be described redundantly here.

Figure 12:
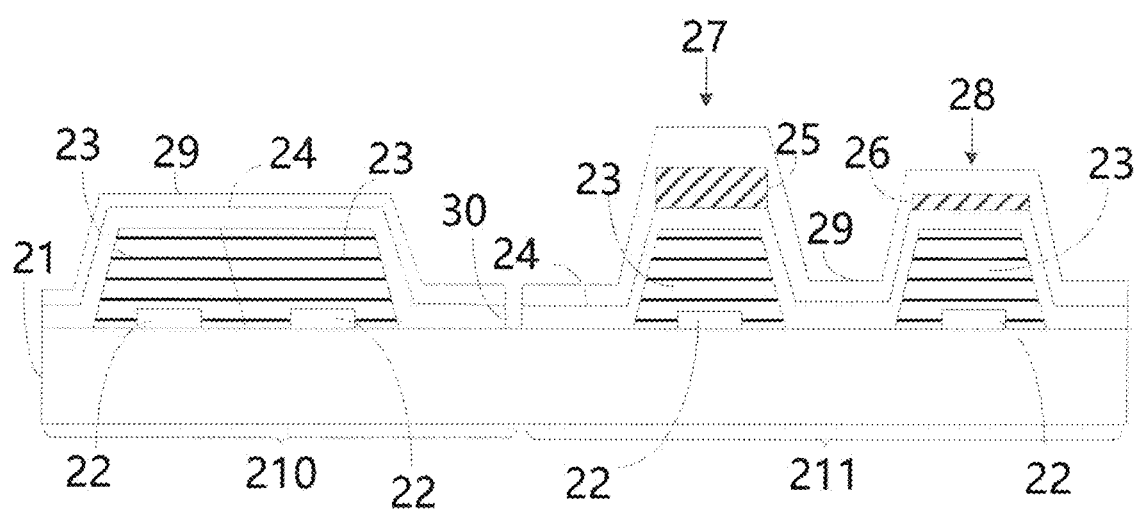
Figure 13:
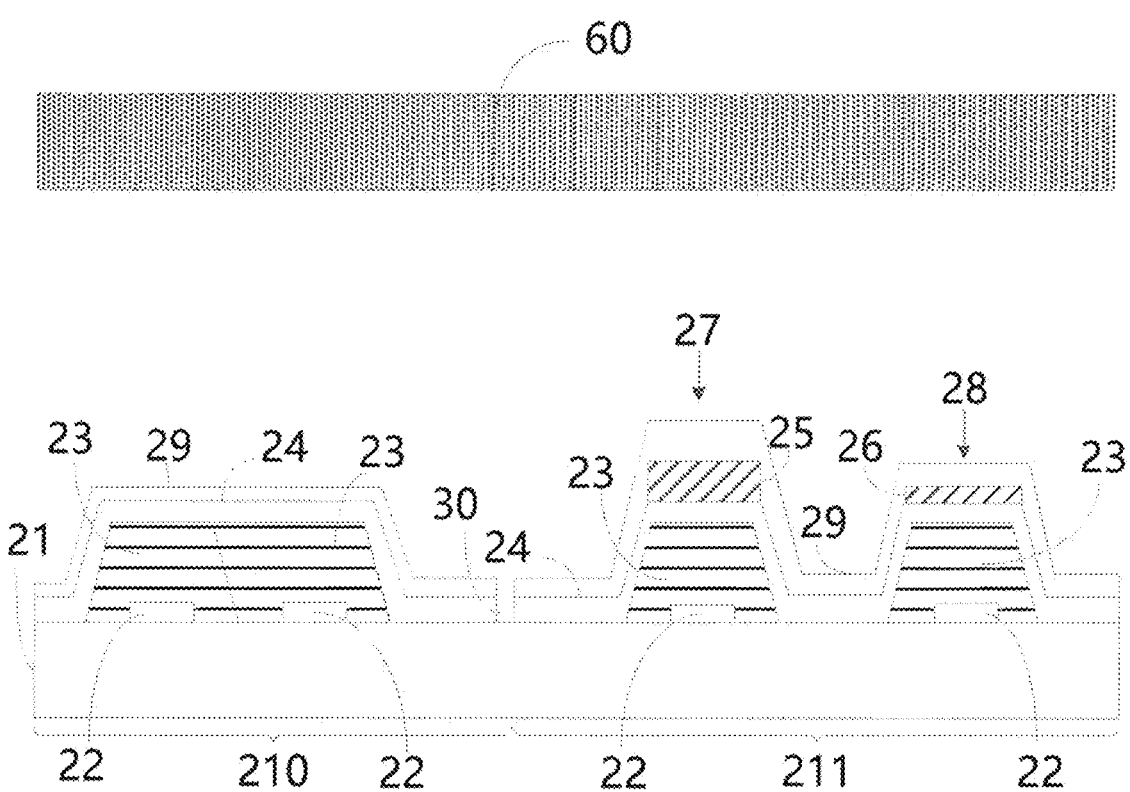
Figure 14:
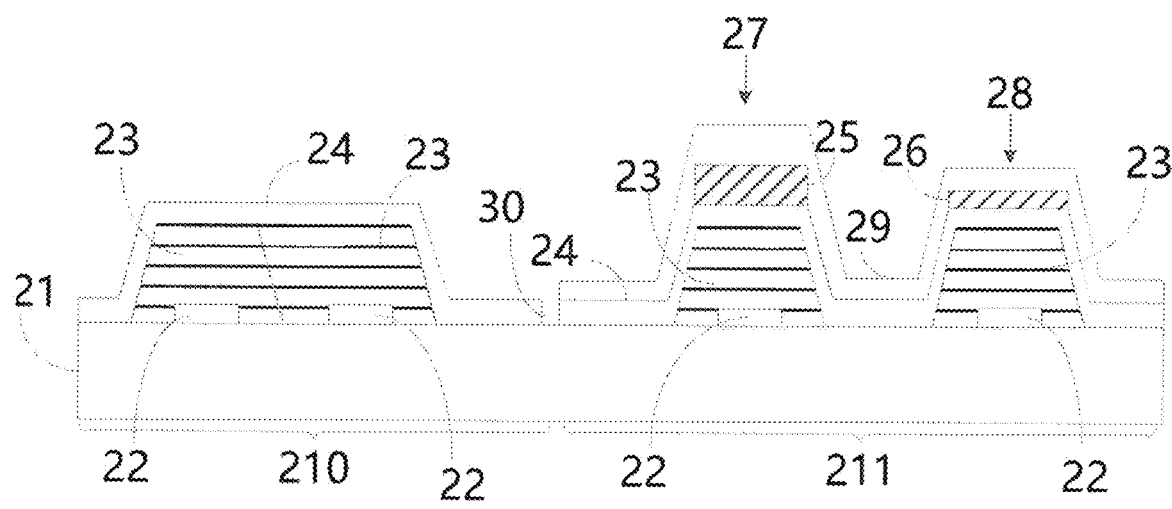

In the step S203, with reference to FIGS. 12, 13 and 14, the light-shielding material 29 is coated on the substrate 21 formed with the photoresist pattern. The light-shielding material 29 is exposed by the second mask plate 60, and then is developed to form the light-shielding layer on the non-display region 211 of the thin film transistor substrate 21.

The light-shielding layer forms the first spacer 27 on the first photoresist reservation region 25, and forms the second spacer 28 on the second photoresist reservation region 26. The second mask plate 60 comprises a light-shielding region 61 and a full light-transmitting region 62. A projection of the light-shielding region 61 on the substrate 21 coincides with the non-display region 211, and a projection of the full light-transmitting region 62 on the substrate coincides with the display region 210.

Specifically, the light-shielding material 29 is coated on the substrate 21 formed with the photoresist pattern, and the light-shielding material 29 is exposed. After exposure, a developing agent is used to form the light-shielding layer on the non-display region 211 of the array substrate 21. The light-shielding layer forms the first spacer 27 on the first photoresist reservation region 25, and forms the second spacer 28 on the second photoresist reservation region 26. It should be noted that the first spacer 27 can comprise color resists 23, an inorganic thin film 24, a first photoresist reservation region 25 and a light-shielding material 29. The second spacer 28 can comprise color resists 23, an inorganic thin film 24, a second photoresist reservation region 26 and a light-shielding material 29. The height of the first spacer 27 is greater than the height of the second spacer 28.

Optionally, the photoresist layer is made of positive photoresist or negative photoresist.

Preferably, the light-shielding material is black light-shielding resin.

For example, the black light-shielding resin material 29 is coated on the thin film transistor array substrate 21 formed with the photoresist pattern, and the black light-shielding resin material 29 can be exposed by a mask plate 60 with a single transmittance. After exposure, a developing agent is used to form a light-shielding layer on the non-display region 211 of the thin film transistor array substrate 21. The light-shielding layer forms the first spacer 27 on the first photoresist reservation region 25, and forms the second spacer 28 on the second photoresist reservation region 26. It should be noted that the first spacer 27 comprises color resists 23, an inorganic thin film 24, a first photoresist reservation region 25 and a black light-shielding resin material 29. The second spacer 28 comprises color resists 23, an inorganic thin film 24, a second photoresist reservation region 26 and a black light-shielding resin material 29. The height of the first spacer 27 is greater than the height of the second spacer 28. Preferably, the first spacer 27 can be the primary spacer performing the primary supporting function. The second spacer 28 can be the auxiliary spacer with its height generally less than the height of the primary spacer, and placed differently relative to the primary spacer. When the display panel is squeezed, the auxiliary space performs auxiliary supporting function. The primary spacer and auxiliary spacer can be formed on the inorganic thin film, as shown in FIG. 13, can be formed on a package thin film. The structure of first spacer and second spacer formed on the package thin film is similar to the structure of the first spacer 27 and the second spacer 28 formed on the inorganic thin film, as reference to the present embodiment, and the detailed description would not be repeated here.

Furthermore, the embodiment is described with the example of the positive photoresist and black light-shielding resin material, but, however the present embodiment is not limited therein.

The array substrate and display panel provided by the embodiment of the present invention are described in detail above. Specific examples are used herein to explain the principle and implementation of the present invention. The description of the above embodiment is only used to help understand the present invention. At the same time, for those skilled in, the art, based on the idea of the present invention, there will be changes in the specific implementation and the extent of application. In summary, the content of this specification should not be construed as a limitation of the present invention.

What is claimed is:

1. A display panel manufacturing method, comprising steps as follows:
   providing a substrate, wherein the substrate comprises a display region and a non-display region;
   forming a photoresist layer on the substrate, and exposing and developing the photoresist layer to form a photoresist pattern on the photoresist layer, wherein the photoresist pattern comprises a first photoresist reservation region and a second photoresist reservation region; and
   coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer;
   wherein the step of forming a photoresist layer on the substrate employs a first mask plate to expose and develop the photoresist layer to form the photoresist pattern, and the photoresist pattern comprises the first photoresist reservation region and the second photoresist reservation region; and
   wherein the photoresist layer is made of positive photoresist or negative photoresist.

2. The display panel manufacturing method as claimed in claim 1, wherein the first mask plate comprises a first light-transmitting region and a second light-transmitting region, a projection of the first light-transmitting region on the photoresist layer coincides with the first photoresist reservation region, and a projection of the second light-transmitting region on the photoresist layer coincides with the second photoresist reservation region.

3. The display panel manufacturing method as claimed in claim 2, wherein a light transmittance of the first light-transmitting region has a first predetermined value, a light transmittance of the second light-transmitting region has a second predetermined value, and the first predetermined value is less than the second predetermined value.

4. The display panel manufacturing method as claimed in claim 3, wherein a thickness of the photoresist layer on the first photoresist reservation region is greater than a thickness of the photoresist layer on the second photoresist reservation region.

5. The display panel manufacturing method as claimed in claim 1, wherein the step of coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer, comprises:

coating the light-shielding material on the portion of the substrate with the photoresist pattern, employing a second mask plate to expose the light-shielding material, and developing the exposed light-shielding material to form the light-shielding layer on the non-display region of the substrate, wherein the light-shielding layer forms the first spacer on the first photoresist reservation region and forms the second spacer on the second photoresist reservation region, and the height of the first spacer is greater than the height of the second spacer.

6. The display panel manufacturing method as claimed in claim 5, wherein the second mask plate comprises a light-shielding region and a full light-transmitting region, a projection of the light-shielding region on the substrate coincides with the non-display region, and a projection of the full light-transmitting region on the substrate coincides with the display region.

7. The display panel manufacturing method as claimed in claim 1, wherein the light-shielding material is black light-shielding resin.

8. A display panel manufacturing method, comprising:
    providing a substrate, wherein the substrate comprises a display region and a non-display region;
    forming a photoresist layer on the substrate, and, exposing and developing the photoresist layer to form a photoresist pattern on the photoresist layer, wherein the photoresist pattern comprises a first photoresist reservation region and a second photoresist reservation region; and
    coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer.

9. The display panel manufacturing method as claimed in claim 8, wherein the step of forming a photoresist layer on the substrate, and exposing and developing the photoresist layer to form a photoresist pattern on the photoresist layer, wherein the photoresist pattern comprises a first photoresist reservation region and a second photoresist reservation region, comprises:
    the step of forming the photoresist layer on the substrate employing a first mask plate to expose and develop the photoresist layer to form the photoresist pattern, and the photoresist pattern comprising the first photoresist reservation region and the second photoresist reservation region.

10. The display panel manufacturing method as claimed in claim 9, wherein the first mask plate comprises a first light-transmitting region and a second fight-transmitting region, a projection of the first light-transmitting region on the photoresist layer coincides with the first photoresist reservation region, and a projection of the second light-transmitting region on the photoresist layer coincides with the second photoresist reservation region.

11. The display panel manufacturing method as claimed in claim 10, wherein a light transmittance of the first fight-transmitting region is a first predetermined value, a light transmittance of the second light-transmitting region is a second predetermined value, and the first predetermined value is less than the second predetermined value.

12. The display panel manufacturing method as claimed in claim 11, wherein a thickness of the photoresist layer on the first photoresist reservation region is greater than a thickness of the photoresist layer on the second photoresist reservation region.

13. The display panel manufacturing method as claimed in claim 8, wherein the step of coating a light-shielding material on a portion of the substrate with the photoresist pattern, and exposing and developing the light-shielding material to form a light-shielding layer on the non-display region of the substrate, wherein the light-shielding layer forms a first spacer on the first photoresist reservation region and forms a second spacer on the second photoresist reservation region, and a height of the first spacer is greater than a height of the second spacer, comprises:

coating the light-shielding material on the portion of the substrate with the photoresist pattern, employing a second mask plate to expose the light-shielding material, and developing the exposed light-shielding material to form the light-shielding layer on the non-display region of the substrate, wherein the light-shielding layer forms the first spacer on the first photoresist reservation region and forms the second spacer on the second photoresist reservation region, and the height of the first spacer is greater than the height of the second spacer.

14. The display panel manufacturing method as claimed in claim 13, wherein the second mask plate comprises a light-shielding region and a full light-transmitting region, a projection of the light-shielding region on the substrate coincides with the non-display region, and a projection of the full light-transmitting region on the substrate coincides with the display region.

15. The display panel manufacturing method as claimed in claim 8, wherein the photoresist layer is made of positive photoresist or negative photoresist.

16. The display panel manufacturing method as claimed in claim 8, wherein the light-shielding material is black light-shielding resin.

\* \* \* \* \*